US010719271B2

(12) United States Patent
Alsasua et al.

(10) Patent No.: US 10,719,271 B2
(45) Date of Patent: Jul. 21, 2020

(54) TEMPERATURE CORRECTION IN MEMORY SUB-SYSTEMS

(71) Applicant: Micron Technology, Inc., Boise, ID (US)

(72) Inventors: Gianni Stephen Alsasua, Rancho Cordova, CA (US); Karl D. Schuh, Santa Cruz, CA (US); Ashutosh Malshe, Fremont, CA (US); Kishore Kumar Muchherla, Fremont, CA (US); Vamsi Pavan Rayaprolu, San Jose, CA (US); Sampath Ratnam, Boise, ID (US); Harish Reddy Singidi, Fremont, CA (US); Renato Padilla, Jr., Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/193,126

(22) Filed: Nov. 16, 2018

(65) Prior Publication Data

US 2020/0159446 A1    May 21, 2020

(51) Int. Cl.
| G11C 7/04 | (2006.01) |
| G06F 3/06 | (2006.01) |
| G06F 12/1009 | (2016.01) |
| G11C 16/34 | (2006.01) |
| G11C 16/26 | (2006.01) |
| G11C 16/04 | (2006.01) |

(52) U.S. Cl.
CPC .......... G06F 3/0659 (2013.01); G06F 3/0604 (2013.01); G06F 3/0679 (2013.01); G06F 12/1009 (2013.01); G11C 16/26 (2013.01); G11C 16/3404 (2013.01); *G06F 2212/1008* (2013.01); *G06F 2212/657* (2013.01); *G11C 16/0483* (2013.01)

(58) Field of Classification Search
CPC .... G06F 3/0659; G06F 3/0604; G06F 3/0679; G06F 12/1009; G06F 16/26; G06F 16/3404
See application file for complete search history.

(56) References Cited

U.S. PATENT DOCUMENTS

| 9,875,062 B2 * | 1/2018 | Yadav ................... G06F 3/0616 |
| 10,249,349 B2 * | 4/2019 | Takizawa ................ G06F 13/00 |
| 10,395,728 B2 * | 8/2019 | Wu ...................... G06F 11/1048 |

* cited by examiner

*Primary Examiner* — Pho M Luu
(74) *Attorney, Agent, or Firm* — Schwegman Lundberg & Woessner, P.A.

(57) ABSTRACT

Various examples are directed to systems and methods of managing a memory device. The memory device may receive a read request describing a logical address at the memory device. The memory device may obtain a table entry associated with the logical address. The table entry comprises a physical address corresponding to the logical address and a write temperature data indicating a write temperature for the logical address. The memory device may determine a corrected threshold voltage for reading the physical address based at least in part on the write temperature data and read the physical address using the corrected threshold voltage.

20 Claims, 7 Drawing Sheets

TEMPERATURE CORRECTION IN MEMORY SUB-SYSTEMS

TECHNICAL FIELD

The present disclosure generally relates to memory sub-systems, and more specifically, relates to temperature correction and management in memory sub-systems.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to a memory sub-system with temperature correction. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Different memory components can include different types of media. Examples of media include, but are not limited to, a cross-point array of non-volatile memory and flash-based memory cells. Flash memory cells can be programmed to individually or collectively to one or a number of programmed states. For example, a single-level cell (SLC) can represent one of two programmed states (e.g., 0 or 1), representing one bit of data. Some flash memory cells can be programmed to more than two programmed states. Such cells can be referred to as multi-state memory cells, multi-digit cells, or multi-level cells (MLCs). In certain examples, MLC can refer to a memory cell that can store two bits of data per cell (e.g., one of four programmed states). Triple-level cell (TLC) can refer to a memory cell that can store three bits of data per cell (e.g., one of eight programmed states). Quad-level (QLC) can refer to a memory cell that can store four bits of data (e.g., one of sixteen programmed states). Unless otherwise specified, MLC is used herein in its broader context to refer to any memory cell that can store more than one bit of data per cell (i.e., that can represent more than two programmed states).

The programmed states of a flash memory cell correspond to different levels of charge stored on the memory cell. An SLC memory cell can be programmed to one level of charge that corresponds to a first programmed state and to a second level of charge that corresponds to a second programmed state. Similarly, a TLC memory cell has eight levels of charge, each corresponding to a different programmed state. To write a particular programmed state to a memory cell, the memory sub-system charges the memory cell to the level of charge corresponding to the programmed state. To read the memory cell, the memory sub-system measures the level of charge on the cell. To measure the level of charge on the memory cell, the memory sub-system applies one or more threshold voltages to the memory cell. This compares the applied threshold voltage to the level of charge on the cell (e.g., to a voltage drop at the memory cell due to the level of charge). If the applied threshold voltage is sufficient to overcome the voltage drop due to the level of charge at the memory cell, then the memory cell changes state. If the applied threshold voltage is not sufficient to overcome the voltage drop due to the level of charge, the memory cell does not change state. For example, in a negative- and (NAND) memory cell, if an applied threshold voltage is sufficient to overcome the voltage drop to the level of charge at the NAND memory cell, then electricity can be conducted between a source and a drain of the NAND memory cell. If not, an open circuit condition exists between the source and the drain of the NAND memory cell. In an SLC memory cell, the memory sub-system applies a single threshold voltage. In MLC cells, additional threshold voltages may be applied to determine the programmed state of the cell.

In some memory cells, the behavior of the memory cell varies with temperature. Consider an example in which a memory cell at a write temperature is written to a first level of charge corresponding to a first programmed state. Later, the memory cell is read while at a read temperature that is different than the write temperature. Due to the temperature-dependent behavior of the memory cell the difference between the read temperature and the write temperature causes the level of charge measured on the memory cell at read time to be offset from the level of charge written to the memory cell at write time. If the offset is large enough, the memory sub-system misidentifies the programmed state of the memory cell. That is, the memory sub-system may read the memory cell at a second programmed state instead of the intended first programmed state.

Aspects of the present disclosure address the above and other deficiencies by embedding write temperature data in a logical-to-physical (L2P) table entry for a data unit stored at the memory sub-system. The write temperature data indicates the write temperature. The write temperature data can be, for example, a set of one or more bits. In some examples, the write temperature data indicates a write temperature range. For example, a two-bit write temperature data includes four possible temperature code values. Each of the four possible temperature code values corresponds to a range of write temperatures. To generate the write temperature data, the memory sub-system classifies a measured write temperature into one of the ranges of temperatures. The memory sub-system then selects write temperature data that corresponds to the classified range. Although this example describes a two-bit write temperature data, write temperature data, in some examples, have more bits or fewer bits. For example, a one-bit write temperature data has two possible temperature code values that correspond to two temperature ranges. A three-bit write temperature data has eight possible right temperature code values that correspond to eight temperature ranges, and so on.

The memory sub-system receives a write request including a data unit and a logical address identifying the data unit. The memory sub-system determines a physical address at a memory component where the data unit will be written. The physical address references specific memory cells at a memory component that will store the data unit. For example, when the memory component is a flash memory component, a physical address may refer to one or more pages of memory cells, one or more blocks of memory cells, etc. The memory sub-system writes the data unit to the physical address.

Responsive to the write request, the memory sub-system also generates an L2P table entry for the data unit, including the write temperature data as described herein. The L2P table entry relates the logical address included with the write request to the physical address where the data unit is or will be stored. The write temperature data is embedded with the L2P table entry. The memory sub-system writes the L2P table entry, including the embedded write temperature data, to a L2P table.

The memory sub-system receives a read request that includes a logical address. Responsive to the read request, the memory sub-system accesses the L2P table entry corresponding to the logical address. The L2P table entry is used to identify the physical address where the desired data unit is stored. In various examples, the L2P table entry also includes a write temperature data indicating the temperature of the memory component when the data unit was written. Based on the write temperature data, the memory sub-system determines one or more offset threshold voltages. The offset threshold voltages are shifted to compensate for the difference between the level of charge on the memory cells at write time and the level of charge on the memory cell at read time. The memory sub-system reads the physical address using the one or more offset threshold voltages to generate the data unit. The data unit is then returned in response to the read request.

In some examples, the L2P table is written to local memory of a memory sub-system controller, and not to a memory component itself. In examples where the L2P table is written to the local memory of the memory sub-system controller, the memory sub-system may be able to access the write temperature data without an additional read operation to a memory component. Also, condensing the write temperature to a write temperature data reduces the storage space required to store an indication of the write temperature of a physical address. This makes it simpler to store the write temperature data at the local memory without increasing the size of the local memory or reducing the size of other data stored there.

Additionally, embedding the write temperature data to the L2P table may allow and/or streamline preemptive temperature correction. For example, offset threshold voltages, if needed, may be utilized the first time that a physical address is read instead of being used after a bit error is detected. Fast read time for the local memory storing the L2P table, and the fact that the L2P table entry for a physical address is accessed at read time.

Figure 1:
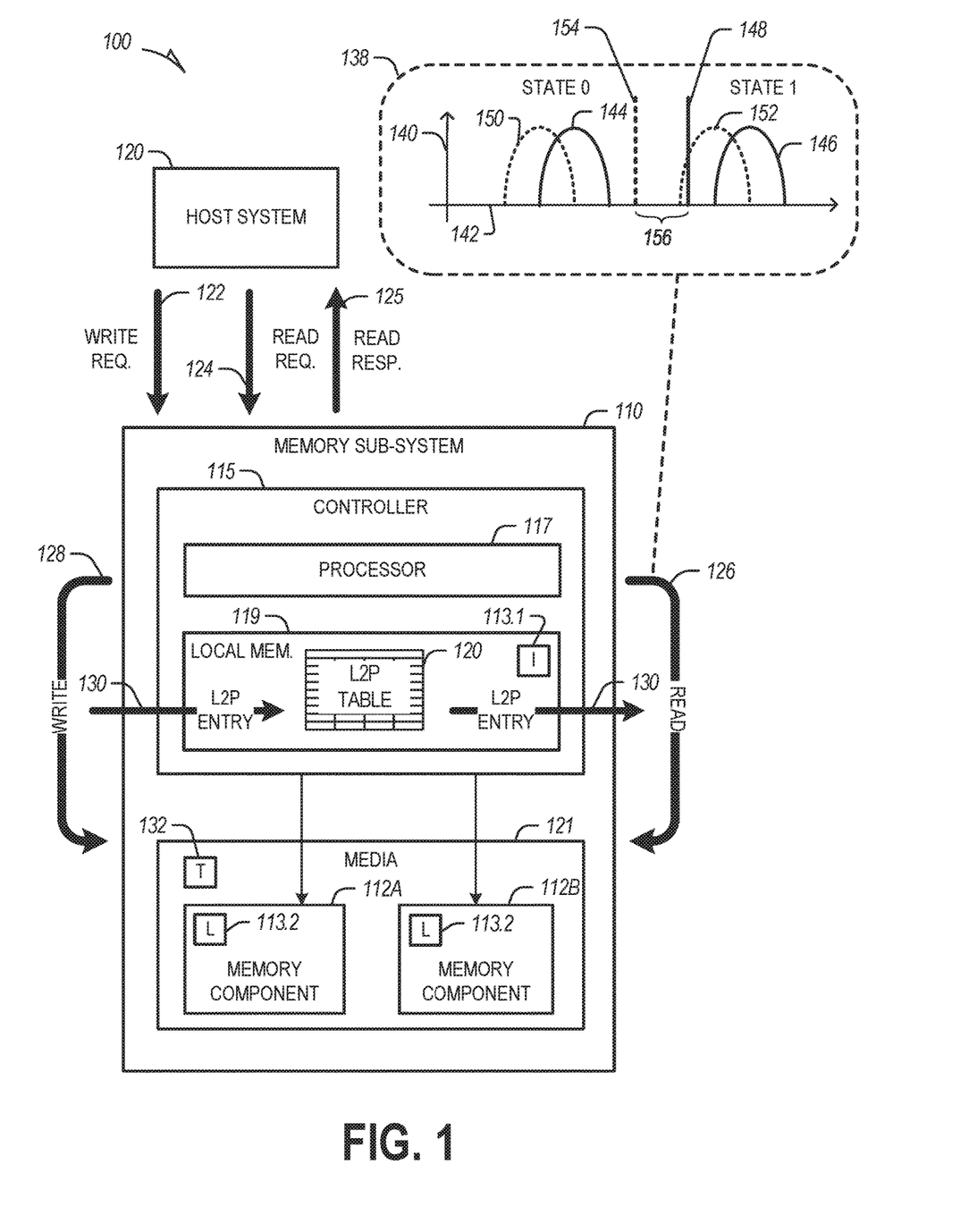
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media 121, such as memory components 112A to 112N. The memory components 112A to 112N can be volatile memory components, non-volatile memory components, or a combination of such. In some embodiments, the memory sub-system 110 is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein. "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as SLCs, or MLCs (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 12N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative- or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. In the example memory sub-system 110 of FIG. 1, the local memory 119 includes the L2P table 120, which may include L2P entries for physical addresses at the various memory components 112A, 112B described herein.

While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical address and a physical address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive a logical address from the controller 115 and decode the logical address to one or more physical addresses at the memory components 112A to 112N.

The memory sub-system 110 of FIG. 1 shows an example write request 122, read request 124, and read response 125. Generally, the write request 122 includes a data unit to be written to the memory sub-system 110 and a logical address referring to that data unit. The memory sub-system 110, executes a write operation 128 to write the data unit to one or more physical addresses at the media 121. For example, the write operation 128 may be executed by the memory system controller 115. The write operation 128 includes generating an L2P entry 130 for the data unit. The L2P entry relates the logical address for the data unit provided with the write request 122 to the physical address or addresses at the media 121 to which the data unit is written. The write operation 128 also includes generating a write temperature data. For example, the memory sub-system 110 receives a temperature signal from a temperature sensor 132 at the media 121. FIG. 1 shows a single temperature sensor at the media 121, however, in some embodiments the temperature signal is received from one or more temperature sensors at some or all of the memory components 112A, 112B.

The memory sub-system 110 condenses the temperature signal to a write temperature data. For example, the memory sub-system 110 compares the write temperature indicated by the temperature signal to a set of temperature ranges, where each of the set of temperature ranges corresponds to a temperature code value. The write temperature data is the temperature code value corresponding to the temperature range of the set of temperature ranges that describes the temperature signal. The memory sub-system 110 embeds the write temperature data to the L2P entry 130. The L2P entry 130 with the write temperature data embedded therein is written to the L2P table 120.

The example of FIG. 1 also shows a read request 124 received by the memory sub-system 110 from the host system 120. The read request 124, in this example, includes the logical address received with the write request 122. Therefore, the read request 124 refers to the same data unit as the write request 122. The memory sub-system 110 responds to the read request 124 by executing a read operation 126. For example, the read operation 126 may be executed by the memory system controller 115.

The read operation 126 includes accessing the L2P entry 130 generated during the write operation 128. The L2P entry 130 may be accessed from the L2P table 120. The memory sub-system 110 uses the L2P entry 130 to determine the physical address or addresses that correspond to the logical address indicated by the read operation 126. The memory sub-system 110 reads the physical address or addresses at the media 121 to retrieve the data unit. The data unit is then returned to the host system 120 at a read response message 125.

In some examples, prior to reading the physical address, the memory sub-system 110 accesses the write temperature data embedded with the L2P entry 130. Based on the write temperature data, the memory sub-system 110 determines one or more offset threshold voltages based on the write temperature data. This may be performed in any suitable manner. For example, the memory sub-system 110 may compare the write temperature data to a reference. In some examples, the reference includes a read temperature signal received from the temperature sensor 132 or another temperature sensor. Based on the comparison, the memory sub-system 110 determines a difference between the write temperature indicated by the write temperature data and the read temperature indicated by the read temperature signal. If the difference is greater than a threshold, the memory sub-system 110 generates one or more offset threshold voltages based on the difference.

In some examples, the reference includes a read temperature code. The memory sub-system 110 generates the read temperature code using the read temperature signal from the temperature sensor 132 or other temperature sensor. This includes, for example, comparing the read temperature signal to a set of temperature ranges. The set of temperature ranges used to generate the read temperature code at the read operation 126 may be the same set of temperature ranges used to generate the write temperature data during the write operation 128. The memory sub-system 110 determines that the read temperature code is equivalent to the temperature code value corresponding to the temperature range of the set of temperature ranges that describes the read temperature signal. The memory sub-system 110 compares the read temperature code to the write temperature data from the L2P entry 130 to determine a difference between the write temperature data and the read temperature code. If the difference is greater than a threshold, the memory sub-system 110 generates one or more offset threshold voltages based on the difference.

Also, in some examples, the reference includes a nominal temperature code. The nominal temperature code represents a nominal temperature range. For example, the nominal temperature code may be the temperature code value corresponding to a temperature range of the set of temperature ranges at which the memory sub-system 110 is most likely to operate. Using a nominal temperature code in this way includes assuming that the memory sub-system 110 is operating within the nominal temperature range. The memory sub-system 110 compares the nominal temperature code to the write temperature data from the L2P entry 130 to determine a difference between the write temperature data and the nominal temperature code. If the difference is greater than a threshold, the memory sub-system 110 generates one or more offset threshold voltages based on the difference.

FIG. 1 also includes an example threshold voltage chart 138 for a physical address, such as a page of memory cells. The threshold voltage chart 138 includes a horizontal axis 142 indicating threshold voltage and a vertical axis 140 indicating a number of memory cells. In the example threshold voltage chart 138, the physical address includes SLC memory cells having two potential programmed states labeled State 0 and State 1. Each programmed state corresponds to one potential value for one bit stored at the respective memory cells of the physical address. The programmed states 0 and 1 are associated with respective threshold voltage distributions 144, 146. The threshold voltage distribution 144 describes the threshold voltages that change the state of the memory cells at the physical address that are written to the programmed state 0. A threshold voltage distribution 146 describes the threshold voltages that change the state of the memory cells at the physical address that are written to the programmed state 1.

A nominal threshold voltage 148 is positioned between the threshold voltage distribution 144 and the threshold voltage distribution 146. Accordingly, when the nominal threshold voltage 148 is applied to the memory cells, memory cells at the programmed state 0, indicated by threshold voltage distribution 144, change state while memory cells at the programmed state 1, indicated by threshold voltage distribution 146, do not change state. To read the physical address, the memory sub-system 110 applies the nominal threshold voltage 148 to memory cells at the physical address. Memory cells that are at the programmed state 0 change state while memory cells that are at the programmed state 1 do not change state.

As described herein, when the physical address is read at a temperature different than its write temperature, the levels of charge on the memory cells shift, causing a corresponding shift in the threshold voltage distribution of the memory cells. Example temperature-shifted threshold voltage distributions 150, 152 show how the memory cells at a physical address may behave when the read temperature is different than the write temperature. As shown, the temperature-shifted threshold voltage distribution 152 intersects the nominal threshold voltage. This means that if a physical address exhibiting the temperature-shifted threshold voltage distributions 150, 152 is read with the nominal threshold voltage 148, some portion of the memory cells at programmed state 1 will be erroneously read at programmed state 0. To correct for this, the memory sub-system 110 reads the physical address with the offset threshold voltage 154. The applied offset 156 is the difference between the nominal threshold voltage 148 and the offset threshold voltage 154. The offset 156 may be determined based on the write temperature data, as described herein.

Although the threshold voltage chart 138 describes a physical address including SLC memory cells, offset threshold voltages based on write temperature data may also be used with physical addresses including MLC memory cells. For example, when the physical address includes MLC memory cells, an offset is applied to all of the threshold voltages used to read the cells. In some examples, the same offset is applied to all of the threshold voltages. In other examples, different offsets are applied to some of the threshold voltages.

Also, although the read operation 126 and write operation 128 are described herein as being executed by the memory sub-system 110 (e.g., the controller 115 thereof), in some examples, read and write operations, as described herein, may be executed at the host system 120. Also, although the write request 122 and read request 124 of FIG. 1 originate at the host system 120, in some examples, read operations 126 and write operations 128 as described herein may be executed for reads and writes that are initiated at the memory sub-system 110.

In some examples, the logic for executing the read operation 126 and/or the write operation 128 is split between the memory sub-system 110 (e.g., the controller 115) and the various memory components 112A, 112B. For example, the local memory 119 may include instructions 113.1 for handling portions of the read request 126 and write request 128 described herein. Similarly, the memory components 112A, 112B may similarly include instructions 113.2 for handling portions of the read request 126 and write request 128 described herein. For example, the controller 115 (e.g., executing the instructions 113.1) may identify an L2P table entry corresponding to a read request and identify a write temperature data embedded in the L2P entry. The controller 115 provides the write temperature data to the appropriate memory component 112A, 112B. The memory component, for example, processing logic 113.2 at the memory component 112A, 112B uses the write temperature data as described herein to read the physical address. On a write request 128, the memory component 112A, 112B (e.g., using logic 113.2) reads the temperature sensor 132 and provides the temperature signal to the controller 115. The controller 115 (e.g., executing the instructions 113.1) generates the write temperature data, embeds the write temperature data to an L2P table entry, and writes the L2P table entry to the L2P table 120. Other arrangements are contemplated.

Figure 2:
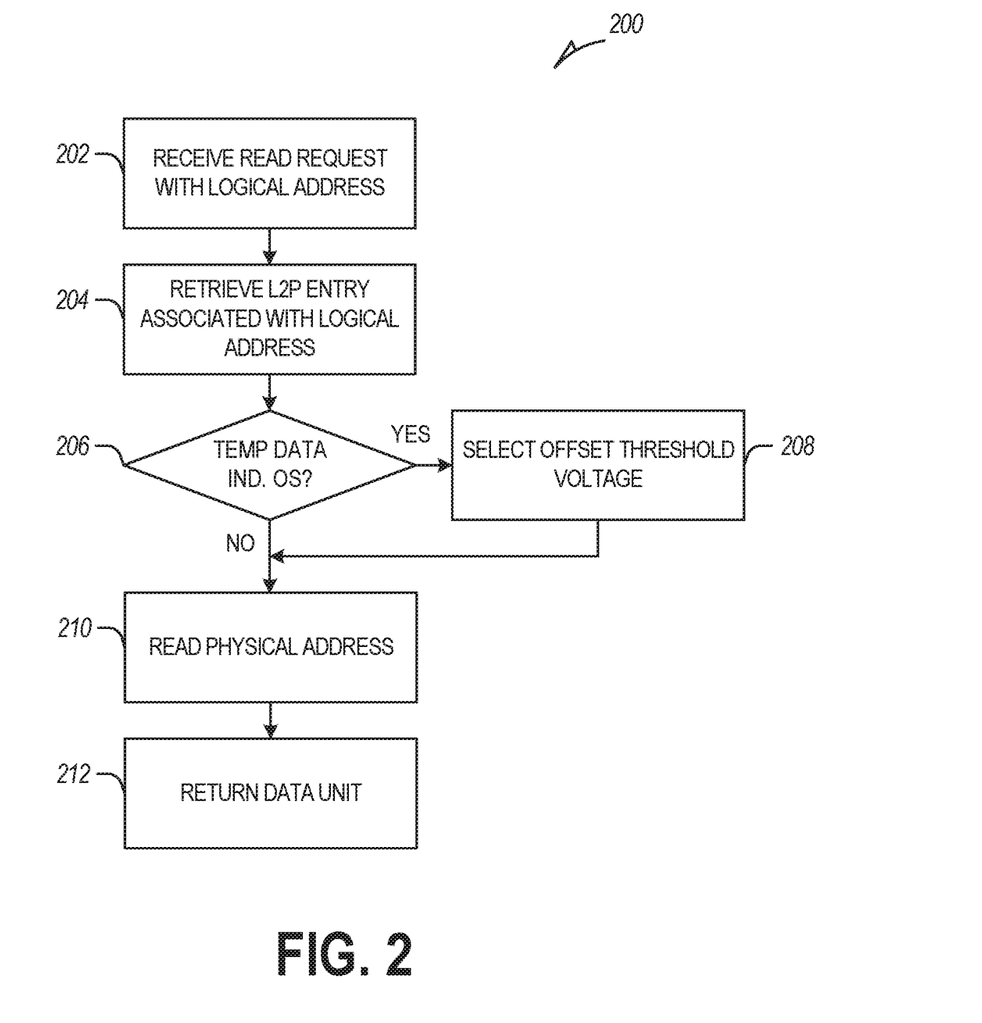
FIG. 2 is a flow diagram of an example method to read data from a memory component based on write temperature data, in accordance with some embodiments of the present disclosure.

FIG. 2 is a flow diagram of an example method 200 to read data from a memory component based on write temperature data, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 202, the processing device receives a read request including a logical address describing a data unit stored at a memory sub-system. At block 204, the processing device accesses an L2P entry associated with the logical address. The L2P entry describes a physical address where the data unit described by the logical address is stored. For example, the L2P entry may include an indication of a channel, plane, block, page, or other descriptor of the physical location of memory cells making up the physical address. The L2P entry may be referenced by the logical address, sometimes referred to as a logical unit number (LUN). The L2P entry also includes a write temperature data, as described herein.

At block 206, the processing device determines whether the write temperature data indicates that the physical address should be read with an offset threshold voltage or voltages. This may be accomplished in various different ways. In some examples, the processing device compares the write temperature data to a reference. The reference may be a temperature signal from a temperature sensor, a read temperature code, a nominal temperature code, etc. If the difference between the write temperature data and the reference is greater than a threshold, then the processing device selects an offset threshold voltage or voltages at block 208. The specific offset may depend on the difference between the write temperature data and the reference. For example, larger differences may call for larger offsets. Also, recall that physical addresses using MLC memory cells are read with multiple threshold voltages. For MLC memory cells, the same offset may be applied to each threshold voltage and/or different offsets may be applied to different threshold voltages.

At block 210, the processing device reads the physical address. If the write temperature data did not indicate a threshold voltage offset, then the processing device reads the physical address with the nominal threshold voltage or voltages. If an offset was applied at block 208, then the physical address is read with the offset threshold voltage or voltages. Reading the physical address produces the data unit stored at the physical address (and referred to by the logical address). At operation 212, the processing device returns the data unit to the component that sent the read request (e.g., the host system, the controller, etc.).

In some examples, the method 200 is executed by the controller 115 of the memory sub-system 110 and/or by the host system 120. In some examples, blocks 206 and 208 are performed at the memory components 112A, 112B. For example, the host system 120 and/or controller 115 may send the memory component 112A, 112B including the physical address a request to read the physical address along with the write temperature data from the L2P table entry. In response, the memory component 112A, 112B applies threshold voltage offsets, if called for by the write temperature data, and returns the data unit.

Figure 3:
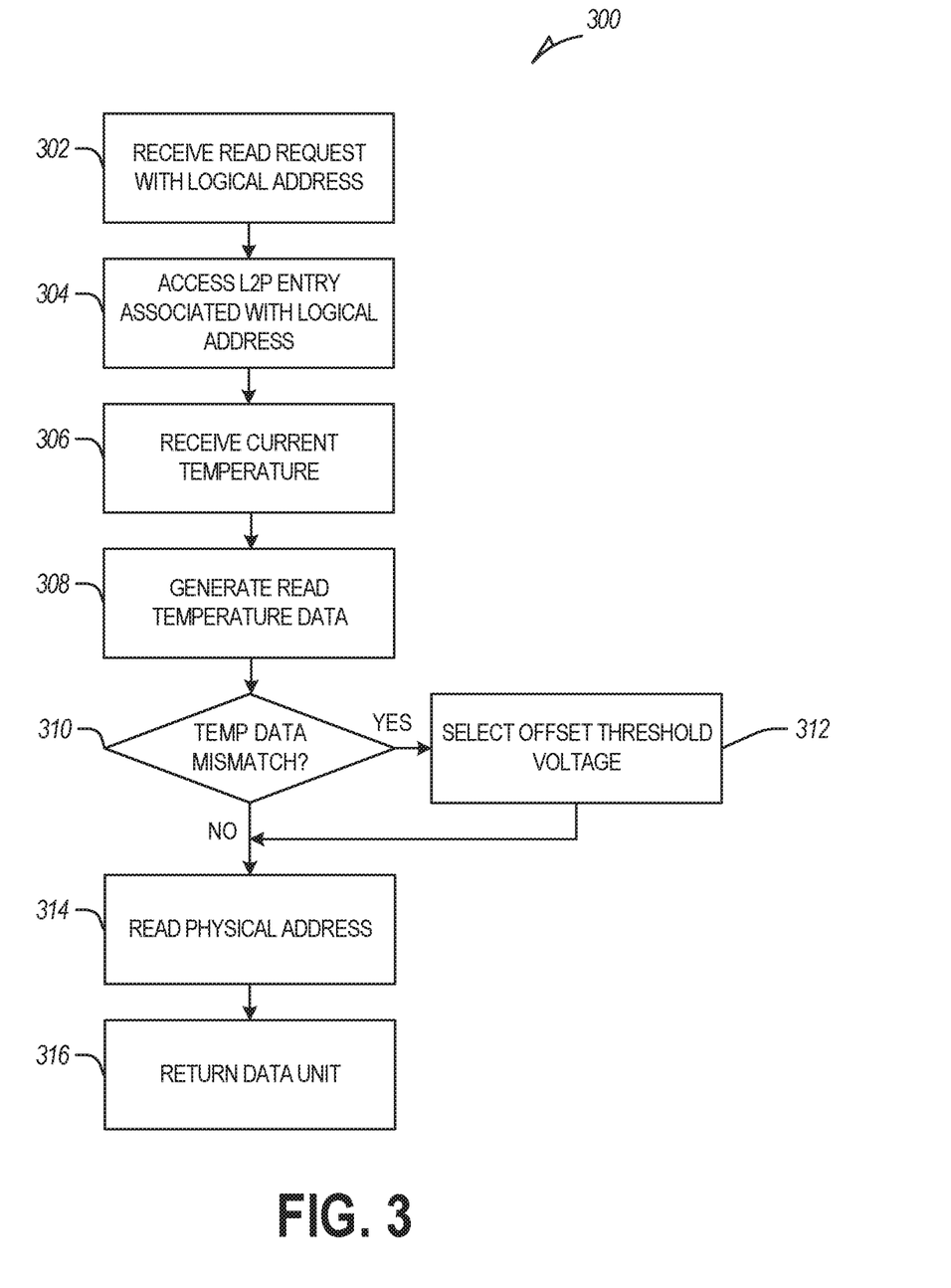
FIG. 3 is a flow diagram of an example method to read data from a memory component based on write temperature data and a read temperature code, in accordance with some embodiments of the present disclosure.

FIG. 3 is a flow diagram of an example method 300 to read data from a memory component based on write temperature data and a read temperature code, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 302, the processing device receives a read request including a logical address describing a data unit stored at a memory sub-system. At block 304, the processing device accesses an L2P entry associated with the logical address. The L2P entry describes a physical address where the data unit described by the logical address is stored.

At block 306, the processing device receives a temperature signal from a temperature sensor. The temperature signal indicates the current temperature of the memory component 112A, 112B including the physical address. Accordingly, the temperature signal indicates the read temperature of the memory component 112A, 112B. At block 308, the processing device generates a read temperature code. For example, the processing device may compare the read temperature signal to a set of temperature ranges, where each of the set of temperature ranges corresponds to a temperature code value. The read temperature code is the temperature code value corresponding to the temperature range of the set of temperature ranges that describes the temperature signal.

At block 310, the processing device determines if there is a temperature code mismatch. A temperature code mismatch occurs when the write temperature data is different than the read temperature code. If a temperature code mismatch is detected, the processing device selects an offset threshold voltage or voltages offset at block 312. The offset threshold voltage or voltages may be determined based on the difference between the write temperature data and the read temperature code.

At block 314, the processing device reads the physical address. The physical address is read using nominal threshold voltages or, offset threshold voltages, if offset threshold voltages were selected at block 312. The data unit read from the physical address is returned at operation 316.

Figure 4:
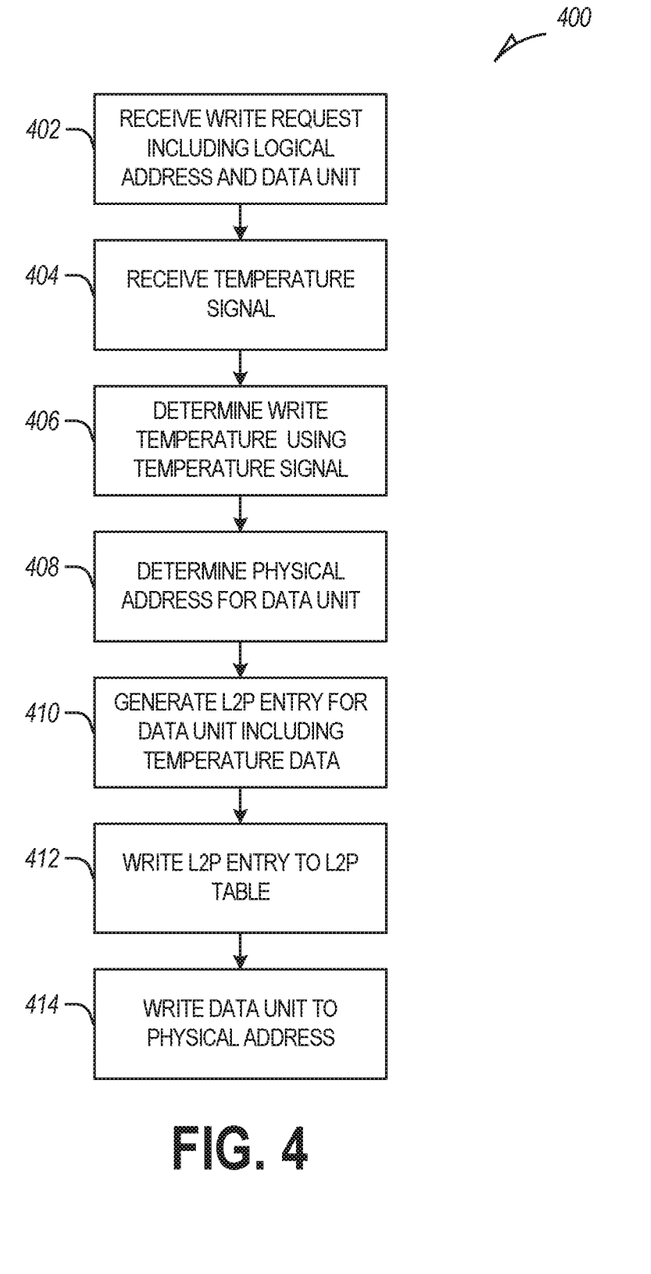
FIG. 4 is a flow diagram of another example method to store data at a memory component based on write temperature data and a read temperature code, in accordance with some embodiments of the present disclosure.

FIG. 4 is a flow diagram of an example method 400 to store data at a memory component based on write temperature data and a read temperature code, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 402, the processing device receives a write request including a logical address and a data unit. The write request may be received from the host system 120 and/or may be an internal request generated at the memory subsystem 110. At block 404, the processing device receives a temperature signal from a temperature sensor 132. The temperature signal indicates a temperature of the memory component 112A, 112B. At block 406, the processing device generates a write temperature data using the temperature signal. The write temperature data may be determined as described herein.

At block 408, the processing device determines a physical address where the data unit will be written. At block 410, the processing device generates an L2P entry for the data unit. The L2P entry includes the logical address included with the write request. The L2P entry also includes the write temperature data, which may be embedded to the L2P entry. The write temperature data may be concatenated to the beginning of the end of the L2P entry. At block 412, the processing device writes the L2P entry to an L2P table, which may be stored at local memory 119 of the controller 115. At block 414, the processing device writes the data unit to the physical address.

Figure 5:
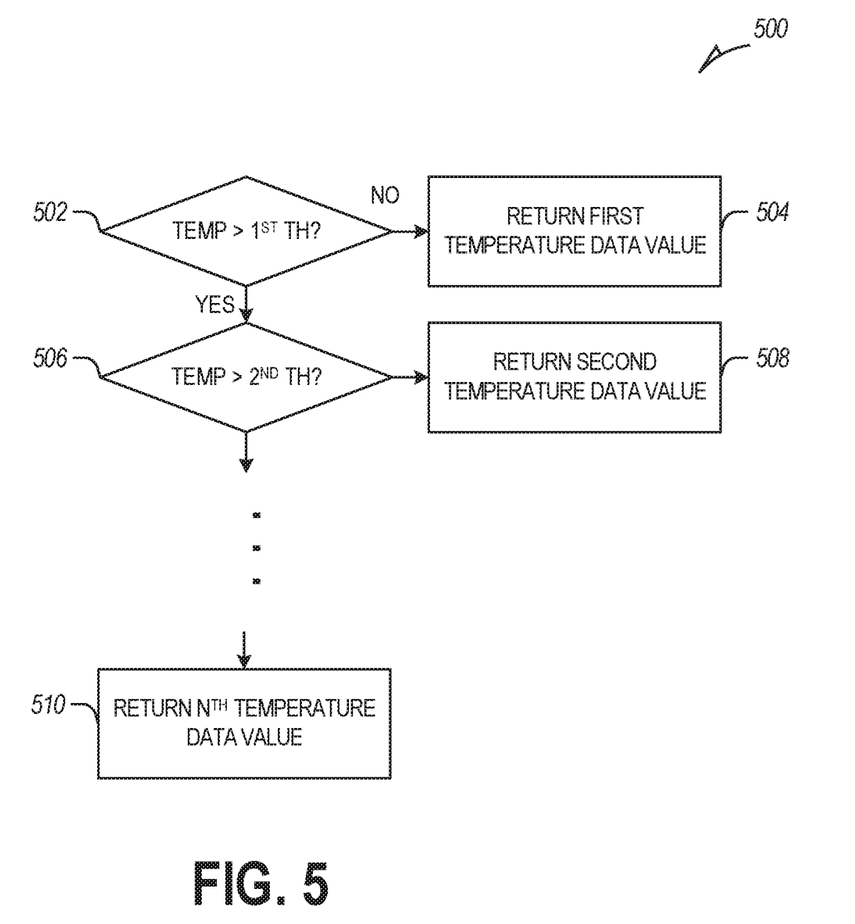
FIG. 5 is an example method to generate a temperature code from a temperature signal, in accordance with some embodiments of the present disclosure.

FIG. 5 is a flow diagram of an example method 500 to generate a temperature code from a temperature signal, in accordance with some embodiments of the present disclosure. The method 500 may be used to generate a write temperature data and/or a read temperature code. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 502, the processing device determines whether a temperature signal is greater than a first threshold temperature. The temperature signal may be received from the temperature system 132 or other suitable temperature sensor indicating a temperature of the memory components 112A, 112B. The first threshold temperature indicates a high end of a first temperature range of a set of temperature ranges. If the temperature signal is not greater than the first threshold temperature, then the temperature signal is in the first temperature range. Accordingly, the processing device returns a first temperature code value corresponding to the first temperature range as the temperature code at block 504.

If the temperature signal is greater than the first temperature threshold, then it is not in the first temperature range. The processing device, at operation 506, determines if the temperature signal is less than a second threshold temperature. The second threshold temperature indicates a high end of a second temperature range of the set of temperature ranges. If the temperature signal is not greater than the second threshold temperature, then the temperature signal is in the second temperature range. Accordingly, the processing device returns a second temperature code value corresponding to the second temperature range as the temperature code at block 508.

If the temperature signal is greater than the second temperature threshold, then it is not in the second temperature range. The processing device may continue to compare the temperature signal to threshold temperatures corresponding to the high ends of the remaining temperature ranges in the set of temperature ranges. For example, if there are N temperature ranges in the set of temperature ranges, and the temperature signal did not fall within any of the other temperature ranges, the processing device, at operation 510, returns the Nth temperature code value corresponding to the Nth temperature range.

TABLE 1 below shows an example set of temperature ranges and corresponding temperature code values. In the example of TABLE 1, the temperature code values include two bits, meaning that there are four temperature ranges in the set of temperature ranges. If the method 500 were executed using the set of temperature ranges of TABLE 1, the first temperature threshold would be 10 C and the second temperature threshold would be 50 C

TABLE 1

| Temperature Range | Description | Temperature Code Value |
| --- | --- | --- |
| <10 C. | Low Temperature | 01 |
| 10 C. to <50 C. | Nominal Temperature | 00 |
| 50 C. to <80 C. | High Temperature | 10 |
| >80 C. | Very High Temperature | 11 |

Figure 6:
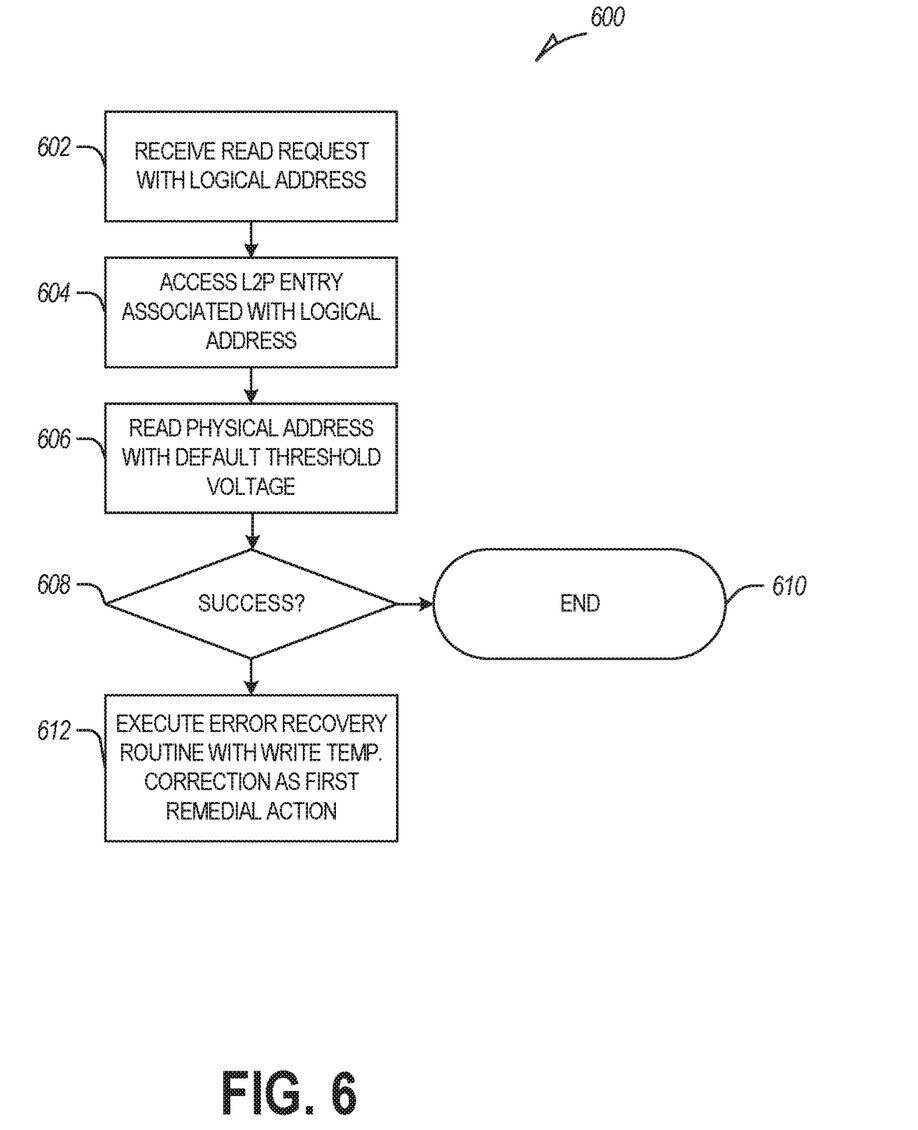
FIG. 6 is a flow diagram of an example method to use a write temperature data with an error recovery routine, in accordance with some embodiments of the present disclosure.

FIG. 6 is a flow diagram of an example method 600 to use a write temperature data with an error recovery routine, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 602, the processing device receives a read request with a logical address. At block 604, the processing device accesses an L2P table entry associated with the logical address. For example, the L2P table entry may include a physical address associated with the logical address and the write temperature data. At block 606, the processing device reads the physical address with a nominal threshold voltage or voltages. At block 608, the processing device determines if the read was successful. This may include determining if the write resulted in more than a threshold number of bit errors. If the read was successful, the process flow may end at operation 610.

If the read was unsuccessful, the processing device calls an error recovery routine. The read may be unsuccessful, for example, as determined by an Error Correction Code (ECC) routine or other suitable technique, for example, implemented at the memory component.

At block 612, the error correction routine is executed to correct the unsuccessful read. In some examples, the processing device passes the write temperature data to the error correction routine. The error correction routine may be executed by the processing device and/or at the memory component itself. The error correction routine compares the write temperature data to a reference, as described herein. When a difference between the write temperature data and the reference indicates that an offset threshold voltage is appropriate, the error correction routine reads the physical address with the appropriate offset threshold voltage or voltages. The read with the offset threshold voltages may be the first remedial action taken by the error correction routine. In this way, a temperature-related error can be determined and corrected (e.g., with offset voltage thresholds) faster with a shallower error correction routine depth.

Figure 7:
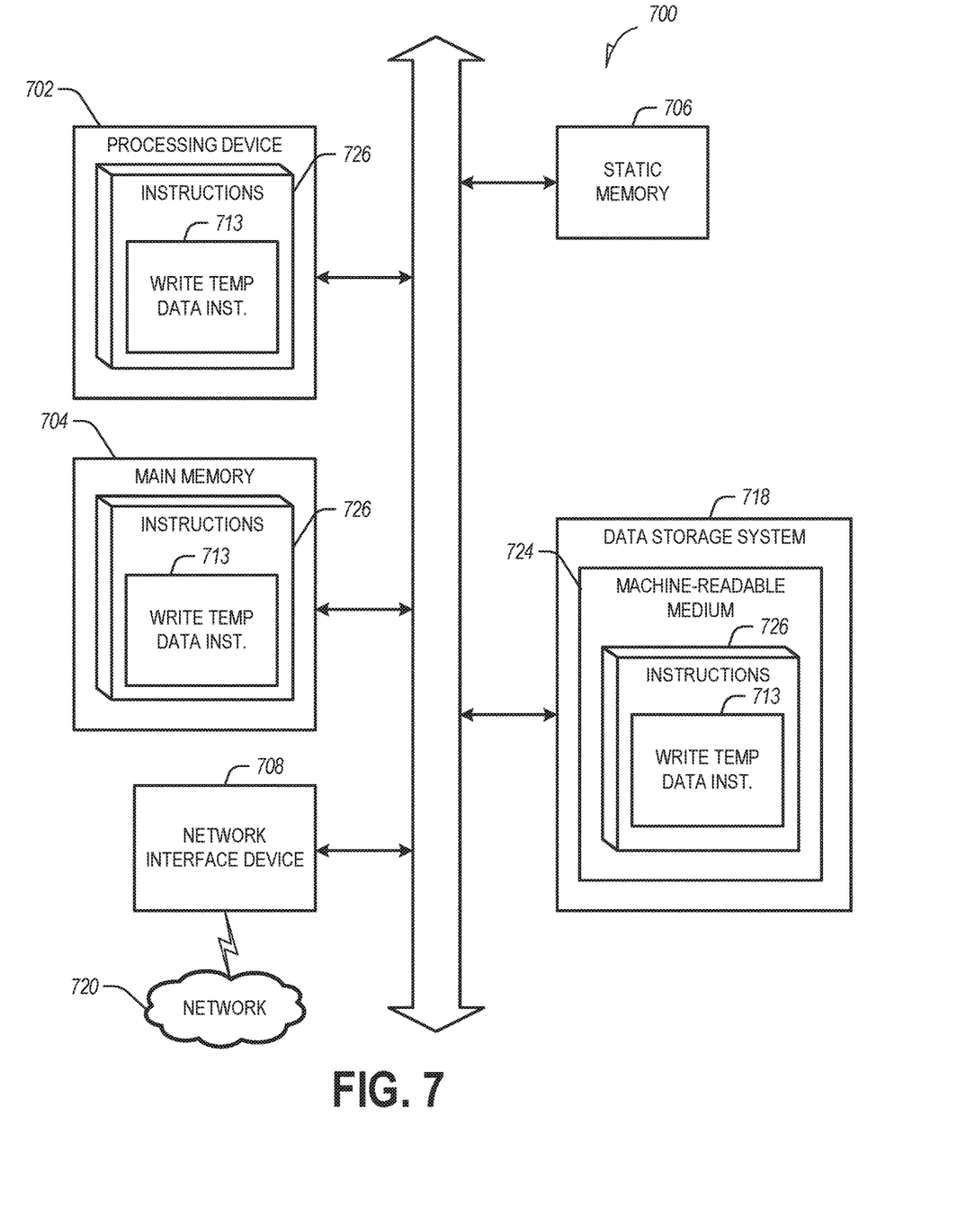
FIG. 7 illustrates an example machine of a computer system within which a set of instructions, for causing the machine to perform any one or more of the methodologies discussed herein, can be executed.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to execute instructions 713 for reading a physical address using a write temperature data and/or generating a write temperature data while writing to a physical address). The instructions 713 may include, for example, instructions 113.1 and/or logic 113.2 described herein. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a non-transitory machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions 713 to implement functionality corresponding to the use of a write temperature data, as described herein. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a memory component comprising a plurality of physical addresses;
   a processing device operably coupled to the memory component, the processing device configured to perform operations comprising:
      receiving a write request describing a logical address;
      receiving a temperature signal from a temperature sensor associated with a memory device;
      determining a write temperature code based at least in part on the temperature signal;
      generating a table entry for the logical address, the table entry comprising the write temperature code and a physical address corresponding to the logical address;
      writing the table entry for the logical address to a table;
      receiving a read request describing the logical address;
      determining, based on the table entry and the logical address, the physical address;
      determining a corrected threshold voltage for reading the physical address based at least in part on the write temperature code; and
      reading the physical address using the corrected threshold voltage.

2. The system of claim 1, wherein the determining of the write temperature code comprises classifying the temperature signal into one of a plurality of temperature ranges, wherein each temperature range of the plurality of temperature ranges corresponds to a temperature code value.

3. The system of claim 1, wherein the processing device is further programmed to perform operations comprising, before determining the corrected threshold voltage, determining that the write temperature code differs from a nominal temperature code.

4. The system of claim 3, wherein the determining of the corrected threshold voltage is also based at least in part on the nominal temperature code.

5. The system of claim 1, wherein the processing device is further programmed to perform operations comprising:
   receiving a read temperature signal from the temperature sensor associated with the memory device;
   comparing the write temperature code to the read temperature signal;
   selecting a corrected threshold voltage offset based at least in part on the comparing of the write temperature code to the read temperature signal; and
   applying the corrected threshold voltage offset to a nominal threshold voltage to generate the corrected threshold voltage.

6. The system of claim 5, wherein the processing device is further programmed to perform operations comprising determining a read temperature code based at least in part on the read temperature signal wherein the comparing of the write temperature code to the read temperature signal comprises comparing the write temperature code to the read temperature code.

7. The system of claim 1, wherein the processing device is further programmed to perform operations comprising:
   before determining the corrected threshold voltage, reading the physical address using a nominal threshold voltage; and
   executing an error recovery routine wherein the reading of the physical address using the corrected threshold voltage is a first remedial action of the error recovery routine.

8. A method, comprising:
   receiving a write request describing a logical address at a memory device;
   receiving a temperature signal from a temperature sensor associated with the memory device;

determining a write temperature code based at least in part on the temperature signal;
generating a table entry for the logical address, the table entry comprising the write temperature code and a physical address corresponding to the logical address;
writing the table entry for the logical address to a table;
receiving a read request describing the logical address;
determining, based on the table entry and the logical address, the physical address;
determining a corrected threshold voltage for reading the physical address based at least in part on the write temperature code; and
reading the physical address using the corrected threshold voltage.

9. The method of claim 8, wherein the determining of the write temperature code comprises classifying the temperature signal into one of a plurality of temperature ranges, wherein each temperature range of the plurality of temperature ranges corresponds to a temperature code value.

10. The method of claim 8, further comprising, before determining the corrected threshold voltage, determining that the write temperature code differs from a nominal temperature code.

11. The method of claim 10, wherein the determining of the corrected threshold voltage is also based at least in part on the nominal temperature code.

12. The method of claim 8, further comprising:
receiving a read temperature signal from the temperature sensor associated with the memory device;
comparing the write temperature code to the read temperature signal;
selecting a corrected threshold voltage offset based at least in part on the comparing of the write temperature code to the read temperature signal; and
applying the corrected threshold voltage offset to a nominal threshold voltage to generate the corrected threshold voltage.

13. The method of claim 12, further comprising determining a read temperature code based at least in part on the read temperature signal, wherein the comparing of the write temperature code to the read temperature signal comprises comparing the write temperature code to the read temperature code.

14. The method of claim 8, further comprising:
before determining the corrected threshold voltage, reading the physical address using a nominal threshold voltage; and
executing an error recovery routine wherein the reading of the physical address using the corrected threshold voltage is a first remedial action of the error recovery routine.

15. A non-transitory machine-readable storage medium comprising instructions thereon that, when executed by a processing device, cause the processing device to perform operations comprising:
receiving a write request describing a logical address at a memory device;
receiving a temperature signal from a temperature sensor associated with the memory device;
determining a write temperature code based at least in part on the temperature signal;
generating a table entry for the logical address, the table entry comprising the write temperature code and a physical address corresponding to the logical address;
writing the table entry for the logical address to a table;
receiving a read request describing the logical address;
determining, based on the table entry and the logical address, the physical address;
determining a corrected threshold voltage for reading the physical address based at least in part on the write temperature code; and
reading the physical address using the corrected threshold voltage.

16. The non-transitory machine-readable storage medium of claim 15, wherein the determining of the write temperature code comprises classifying the temperature signal into one of a plurality of temperature ranges, wherein each temperature range of the plurality of temperature ranges corresponds to a temperature code value.

17. The non-transitory machine-readable storage medium of claim 15, further comprising instructions thereon that, when executed by the processing device, cause the processing device to perform operations comprising, before determining the corrected threshold voltage, determining that the write temperature code differs from a nominal temperature code.

18. The non-transitory machine-readable storage medium of claim 17, wherein the determining of the corrected threshold voltage is also based at least in part on the nominal temperature code.

19. The non-transitory machine-readable storage medium of claim 15, wherein the operations further comprise:
receiving a read temperature signal from the temperature sensor associated with the memory device;
comparing the write temperature code to the read temperature signal;
selecting a corrected threshold voltage offset based at least in part on the comparing of the write temperature code to the read temperature signal; and
applying the corrected threshold voltage offset to a nominal threshold voltage to generate the corrected threshold voltage.

20. The non-transitory machine-readable storage medium of claim 19, wherein:
the operations further comprise determining a read temperature code based at least in part on the read temperature signal; and
the comparing of the write temperature code to the read temperature signal comprises comparing the write temperature code to the read temperature code.

* * * * *